United States Patent
Reddy et al.

(10) Patent No.: US 9,991,847 B2
(45) Date of Patent: Jun. 5, 2018

(54) METHOD AND APPARATUS FOR BROADBAND DATA CONVERSION

(75) Inventors: Madhukar Reddy, Carlsbad, CA (US); Eric Fogleman, San Marcos, CA (US); Curtis Ling, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 1038 days.

(21) Appl. No.: 13/336,451

(22) Filed: Dec. 23, 2011

(65) Prior Publication Data

US 2012/0163518 A1 Jun. 28, 2012

Related U.S. Application Data

(60) Provisional application No. 61/427,088, filed on Dec. 23, 2010.

(51) Int. Cl.
*H03D 7/16* (2006.01)
*H04B 1/10* (2006.01)
*H04B 15/04* (2006.01)

(52) U.S. Cl.
CPC ........... *H03D 7/165* (2013.01); *H04B 1/1027* (2013.01); *H04B 15/04* (2013.01); *H03D 2200/005* (2013.01); *H04B 2215/065* (2013.01); *H04B 2215/068* (2013.01)

(58) Field of Classification Search
USPC ................................. 375/350, 346
See application file for complete search history.

(56) References Cited

U.S. PATENT DOCUMENTS

| | | | | |
|---|---|---|---|---|
| 5,321,847 A | * | 6/1994 | Johnson, Jr. ................. | 455/63.1 |
| 7,701,917 B2 | * | 4/2010 | Mantravadi et al. ......... | 370/343 |
| 8,160,187 B1 | * | 4/2012 | Turner et al. ................. | 375/346 |
| 8,260,215 B2 | * | 9/2012 | Wenink et al. ................. | 455/87 |
| 8,542,645 B2 | * | 9/2013 | Parkvall et al. .............. | 370/329 |
| 2004/0137863 A1 | * | 7/2004 | Walton et al. ................ | 455/130 |

* cited by examiner

*Primary Examiner* — Nader Bolourchi
(74) *Attorney, Agent, or Firm* — McAndrews, Held & Malloy, Ltd.

(57) ABSTRACT

A receiver may receive a signal and process each of a plurality of sub-bands of the received signal via a respective one of a plurality of first-type receive chains. The receiver may utilize a signal output by a first one of the plurality of the first-type receive chains to remove undesired signals from a signal output by a second one of the plurality of the first-type receive chains. The undesired signals may comprise aliases and/or harmonics of one or more signals that fall within a sub-band of the first one of the plurality of the first-type receive chains. The receiver may downconvert, filter, and digitize each of the plurality of sub-bands via a corresponding one of the plurality of the first type receive chains. The received signal may encompass the cable television band, and each of the plurality of sub-bands may comprise a plurality of cable television channels.

20 Claims, 8 Drawing Sheets

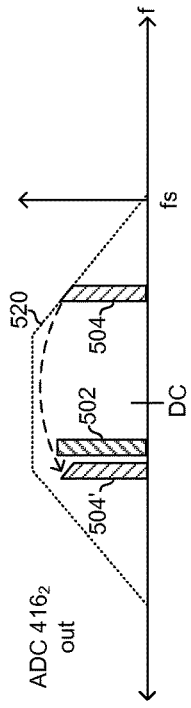
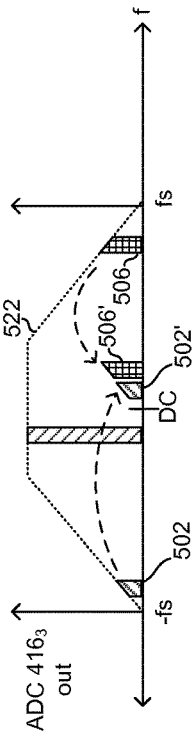
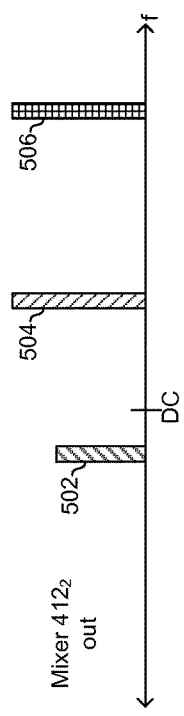
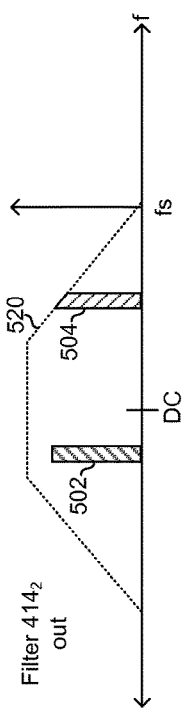
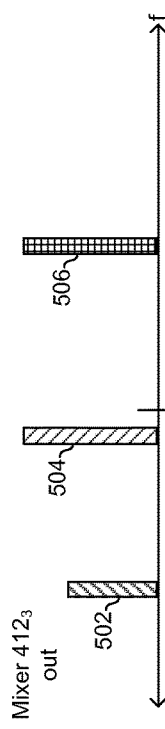
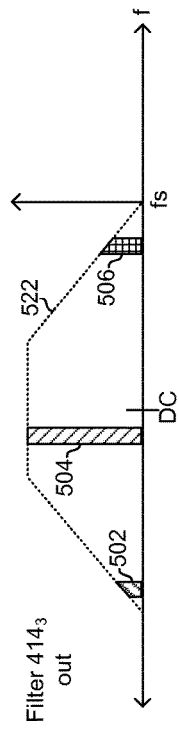

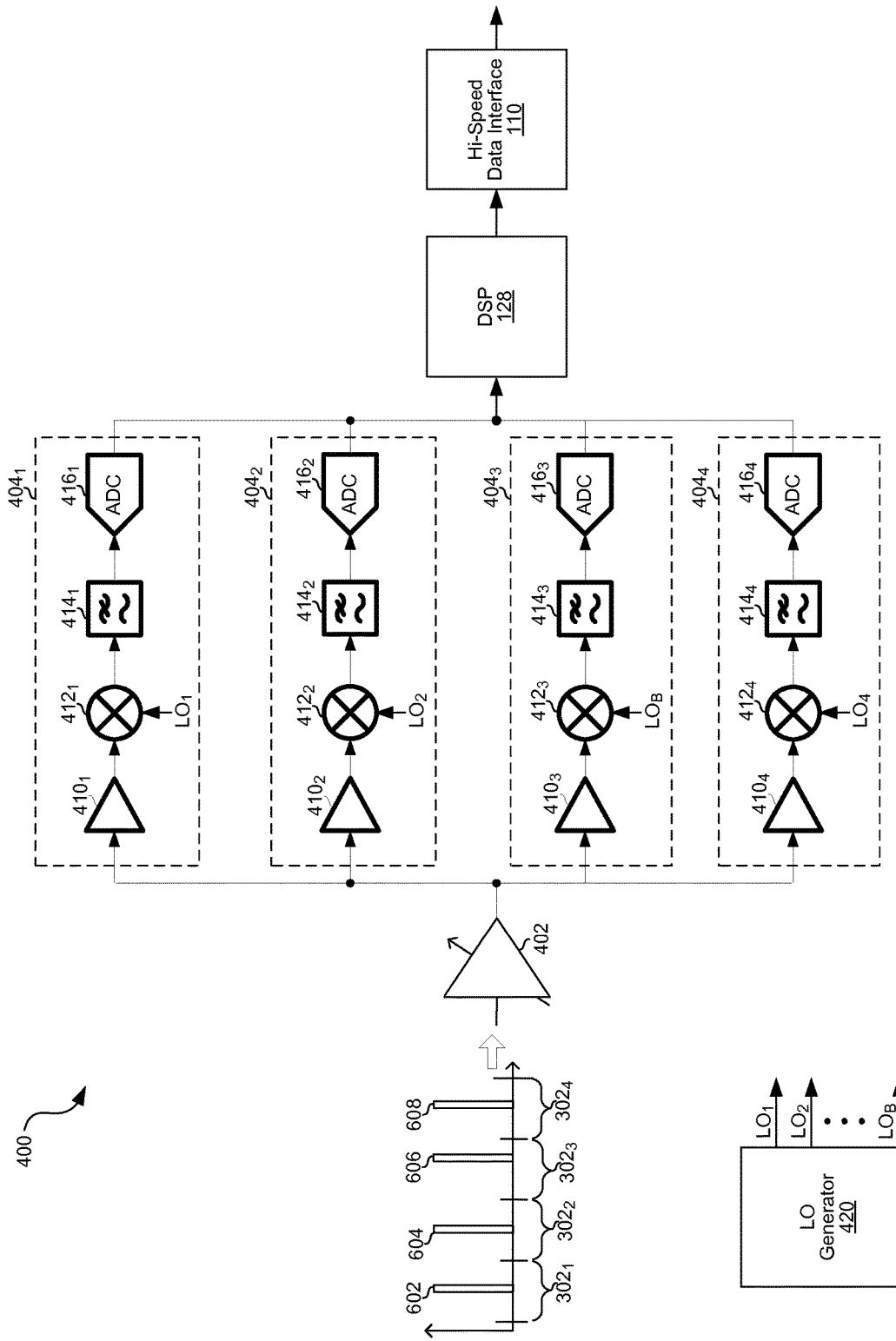

US 9,991,847 B2

METHOD AND APPARATUS FOR BROADBAND DATA CONVERSION

CLAIM OF PRIORITY

This patent application makes reference to, claims priority to and claims benefit from U.S. Provisional Patent Application Ser. No. 61/427,088 filed on Dec. 23, 2010.

The above-incorporated application is hereby incorporated herein by reference in its entirety.

INCORPORATION BY REFERENCE

This patent application also makes reference to U.S. patent application Ser. No. 12/432,666 filed on Apr. 29, 2009.

The above-incorporated application is hereby incorporated herein by reference in its entirety.

FIELD OF THE INVENTION

Certain embodiments of the invention relate to signal processing. More specifically, certain embodiments of the invention relate to a method and apparatus for broadband data conversion.

BACKGROUND OF THE INVENTION

Conventional methods and systems for data conversion are too large, power intensive, and inflexible. Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for broadband data conversion, substantially as illustrated by and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF THE DRAWINGS

FIG. 5A-5G depict exemplary signals of the receiver shown in FIG. 4.

FIG. 6A-6B depict power management in a receiver comprising a plurality of sub-band receive chains.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and or otherwise be associated with the hardware. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the term "e.g.," introduces a list of one or more non-limiting examples, instances, or illustrations.

Figure 1:
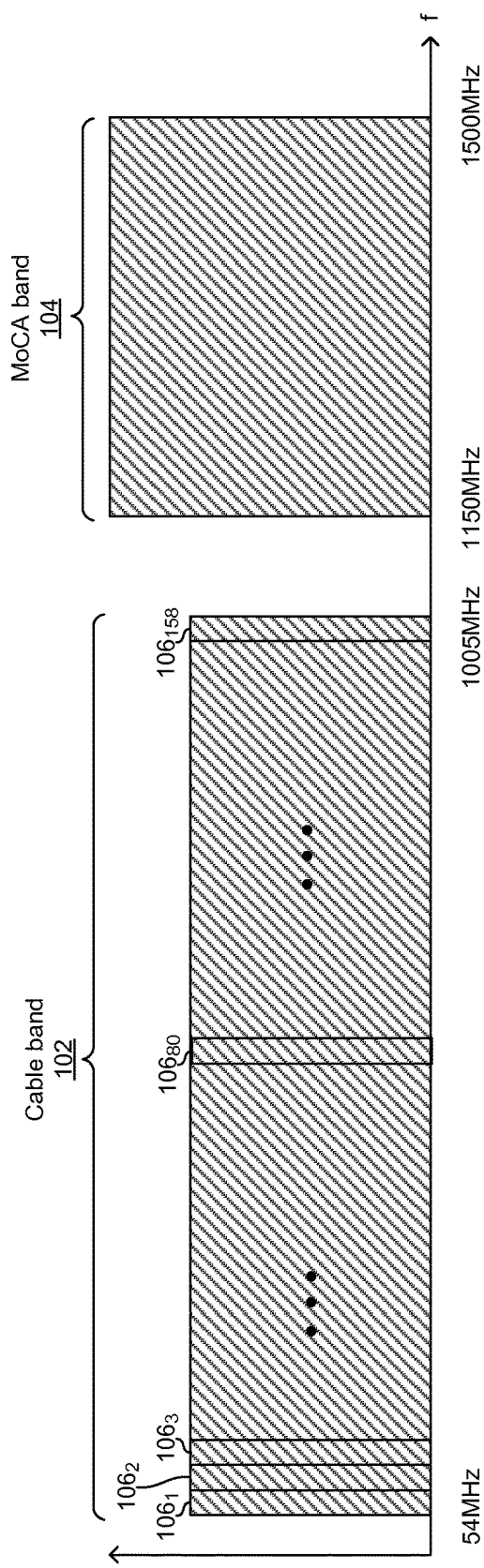
FIG. 1 is a diagram of a portion of the frequency spectrum in a cable television system.

FIG. 1 is a diagram of a portion of the frequency spectrum in a cable television system. The cable band 102 spans from 54 MHz to 1005 Mhz. The depicted (Multimedia over Coax Alliance) MoCA band ("Band D" of the MoCA specification) spans from approximately 1150 MHz to 1500 MHz. The cable band comprises a plurality of channels 106, which may be, for example, 6 or 8 MHz wide. In the embodiment depicted, there are 158 channels of which exemplary channels $106_1$, $106_2$, $106_3$, $106_{80}$, and $106_{158}$ are shown.

Figure 2:
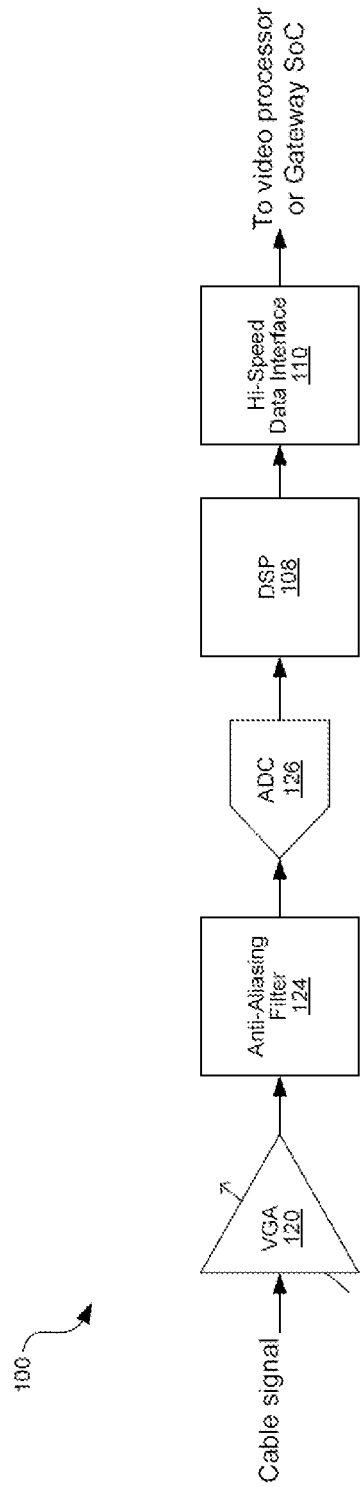
FIG. 2 is a diagram illustrating broadband data conversion utilizing a single receive chain.

FIG. 2 is a diagram illustrating broadband data conversion utilizing a single receive chain. The portion 100 of the receiver comprises variable gain amplifier (VGA) 120, an anti-aliasing filter (AAF) 124, an analog-to-digital converter (ADC) 126, a digital signal processor (DSP) 108, and a high-speed data interface 110.

In operation, the variable gain amplifier (VGA) 120 may amplify a received cable television signal across the entire band 102. The AAF 124 may filter this signal to select the cable band 102 and remove other bands such as the MoCA band 104. The ADC 126 may then digitize the entire band 102. The DSP 108 then processes the digitized band 102 and conveys digital signals to the interface 110 for output to a video processor or a gateway system on chip (SoC). Because of the wide bandwidth and sharp roll-off needed for the AAF 124, it is typically a large and expensive component that is realized on a separate chip. Similarly, because of the large bandwidth of the band 102, the ADC 126 needs to have very high performance, making it another expensive component. Accordingly, aspects of the invention enable reducing the performance requirements of an anti-aliasing filter and ADC such that a cable television receiver may utilize smaller and/or cheaper components.

Figure 3:
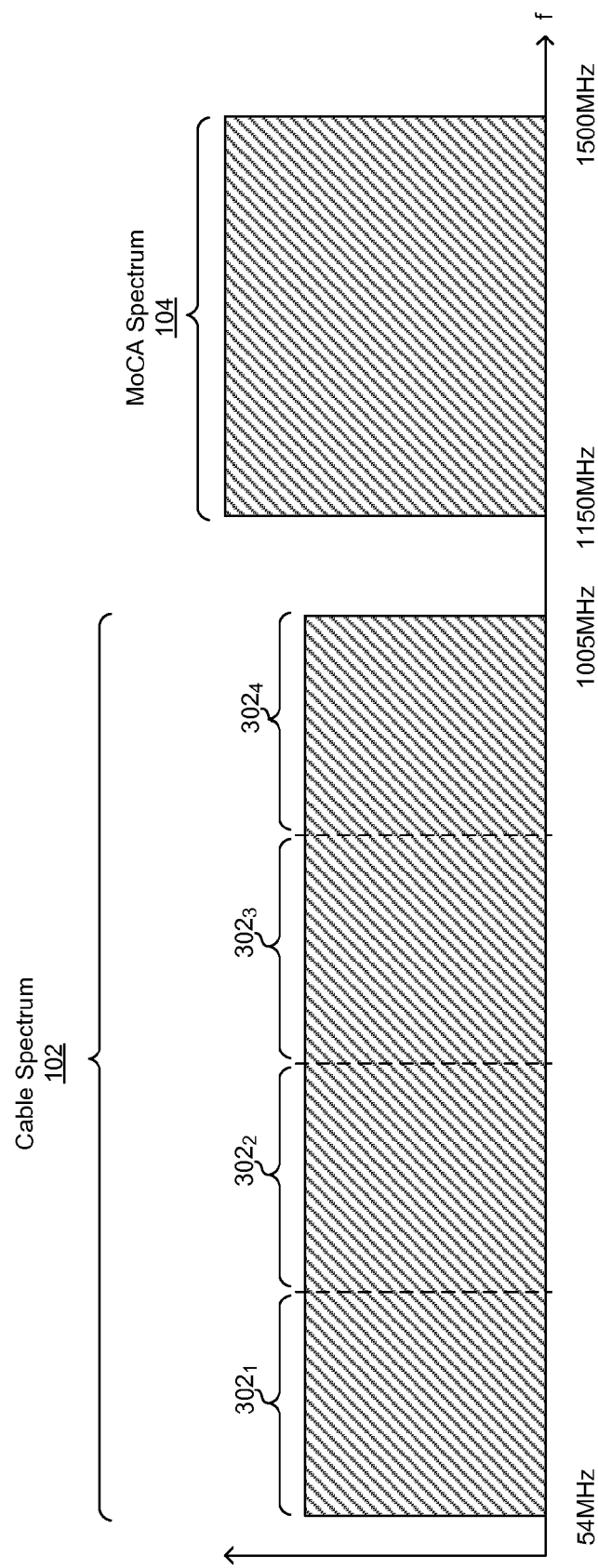
FIG. 3 is a diagram illustrating segmenting of the cable television spectrum for data conversion utilizing a plurality of analog-to-digital converter.

FIG. 3 is a diagram illustrating segmenting of the cable television spectrum for data conversion utilizing a plurality of analog-to-digital converter. Referring to FIG. 3, the cable spectrum is segmented into sub-bands $302_1$-$302_B$. Although four sub-bands are utilized for illustration, the cable spectrum 102 may be segmented into any integer number, B, of sub-bands without deviating from the scope of the present invention. The bandwidth of the sub-bands may be chosen based on, for example, size and/or cost constraints of the ADCs and/or AAFs utilized to process the sub-bands. The sub-bands $302_1$-$302_4$ may be non-overlapping and/or may be substantially non-overlapping with a relatively small amount of overlap (e.g., a few MHz for a ~250 MHz wide sub-band) to provide some guard band at the edges of the sub-bands.

Figure 4:
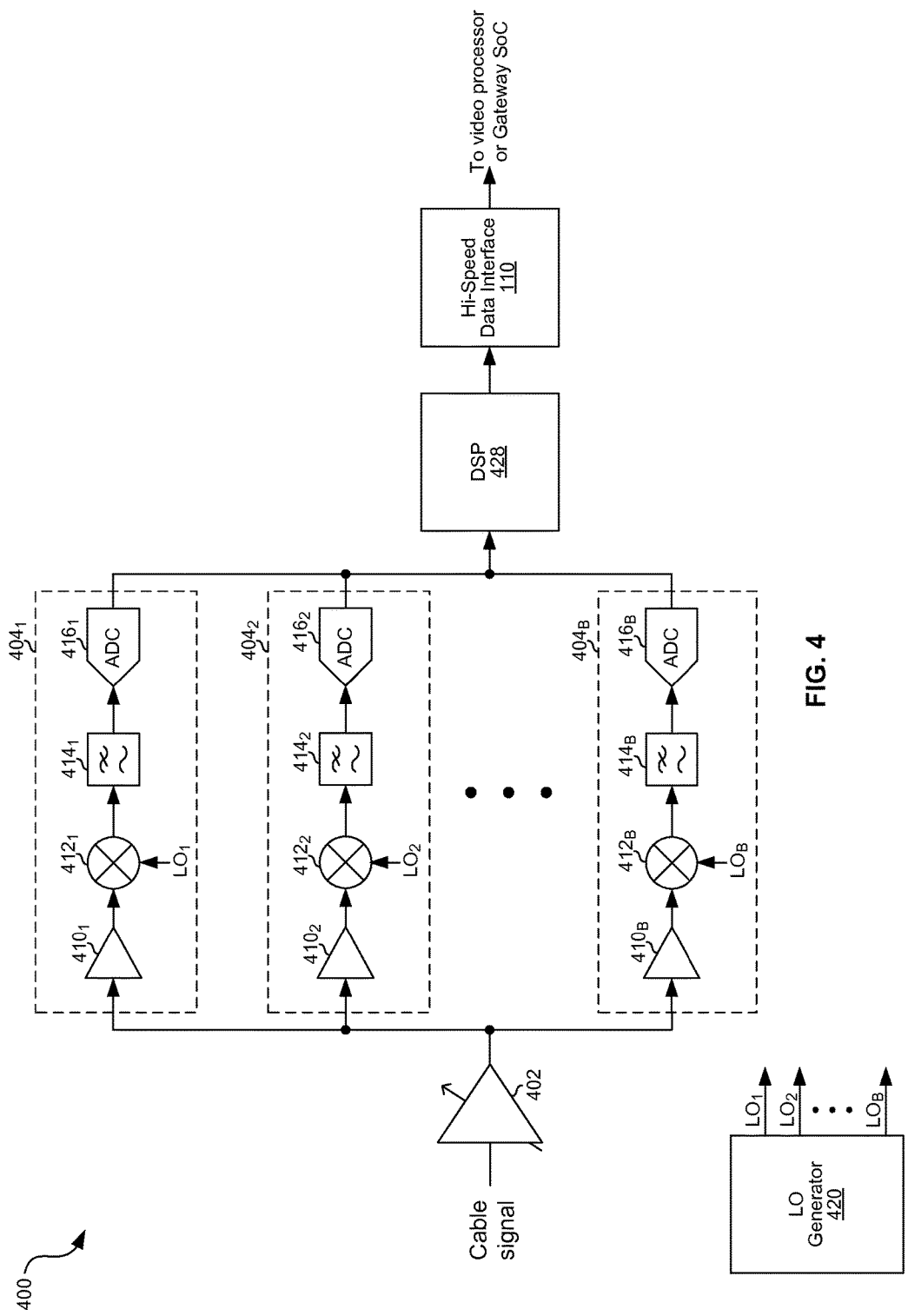
FIG. 4 is a diagram illustrating broadband data conversion utilizing a plurality of receive chains.

FIG. 4 is a diagram illustrating broadband data conversion utilizing a plurality of receive chains. The receiver 400 of FIG. 4 comprises a variable gain amplifier 402, a local oscillator (LO) generation module 420, a digital signal processing module (DSP) 428, a high-speed data interface module 110, and a plurality of receive chains $404_1$-$404_B$. Each of the receive chains $404_1$-$404_B$ may comprise an amplifier $410_b$, a mixer $412_b$, an AAF $414_b$, and an ADC $416_b$, where b is an integer between 1 and B. In an exemplary embodiment, the receiver 400 may be a system on chip integrated on a single die, or may comprise a plurality of dies.

In an exemplary embodiment, each of the receive chains $404_1$-$404_B$ operates over a narrow and/or substantially-fixed frequency band. Accordingly, each of the receive chains $404_1$-$404_B$ may be optimized for its respective band(s) rather than needing to be designed to cover the entire cable spectrum. As a result, each of the receive chains $404_1$-$404_B$ may be smaller, less expensive, and/or lower power than the receive chain 100 described with respect to FIG. 2.

In an exemplary embodiment, one or more of the receive chains $404_1$-$404_B$ may be configurable to operate over a one or more sub-bands that overlap with one or more sub-bands which are processed by other ones of the receive chains. For example, one of the receive chains $404_1$-$404_B$ may be operable to process the entire cable band 102 while each of the other receive chains $404_1$-$404_B$ processes a respective one of the sub-bands.

The variable gain amplifier (VGA) 402 may comprise circuitry operable to amplify a received cable television signal across the entire band 102. The gain of the VGA 402 may be controlled via one or more control signals (not shown) and may be controlled, for example, via an automatic gain control loop.

The LO generator 420 may comprise circuitry for generating local oscillator signals $LO_1$-$LO_B$. In an exemplary embodiment, each of the signals $LO_1$-$LO_B$ may be a pair of signals in phase-quadrature. In various embodiments, a phase and/or frequency of one or more $LO_1$-$LO_B$ may be fixed, programmable, or dynamically controlled via, for example, a feedback loop.

Each amplifier $410_b$ may comprise circuitry operable to amplify the sub-band $302_b$ of the amplified cable signal output by the VGA 402. In an exemplary embodiment, each amplifier $410_b$ may provide frequency selectivity (e.g., low-pass, bandpass, or high-pass filtering) such that the band $302_b$ is amplified by the amplifier $410_b$ while other sub-bands are not amplified or are even attenuated by the amplifier $410_b$.

Each mixer $412_b$ may comprise circuitry operable to down-convert the sub-band $302_b$ to an intermediate frequency or to baseband by mixing the signal output from amplifier $410_b$ with the signal $LO_b$ output by the LO generator 420. Each mixer $412_b$ may, for example, be as described in the above-incorporated U.S. patent application Ser. No. 12/432,666.

Each anti-aliasing filter $414_b$ may comprise circuitry operable to low-pass and/or band-pass filter the output of the mixer $412_b$ to reducing aliasing in the ADC $416_b$. In an exemplary embodiment, the center frequency and/or bandwidth of the AAF $414_b$ may be fixed, programmable, and/or dynamically controlled during operation of the receive chain $404_b$ via, for example, a feedback loop. In an exemplary embodiment, the bandwidth of the filter $414_b$ may be controlled based on the bandwidth of the sub-band $302_b$.

Each analog-to-digital converter (ADC) $416b$ may comprise circuitry operable to convert the filtered analog signal output by filter $414_b$ into a digital representation. In an exemplary embodiment, the sample rate, resolution, and/or dynamic range of the ADC $416_b$ may be fixed, programmable, and/or dynamically controlled during operation of the receive chain $404_b$ via, for example, a feedback loop. In an exemplary embodiment, the sample rate of the ADC $416_b$ may be controlled based on the bandwidth of the sub-band $302_b$.

The digital signal processor (DSP) 428 may comprise circuitry operable to process the digital signals received from the ADCs $416_1$-$416_B$ to recover information contained in the signals. For example, the DSP 428 may perform calibration, filtering, demodulation, error correction, and/or other functions. In an exemplary embodiment, the DSP 428 may be operable to cancel out signal aliases and and/or inter-modulation products as, for example, described below with respect to FIGS. 5A and 5B.

The DSP 428 may also be operable to generate control signals for configuring the receive chains $404_1$-$404_B$ and/or the LO generator 420. For example, the DSP 428 may control the frequencies of the signals $LO_1$-$LO_4$, the gain of the VGA 402 and amplifiers $410_1$-$410_4$, the cutoff and/or center frequencies of the filter $414_1$-$414_4$, and/or the resolution, dynamic range, and/or sampling frequency of the ADC $416_1$-$416_4$. In an exemplary embodiment, as described below with respect to FIGS. 6A-6B, the DSP 428 may be operable to enable and disable components (e.g., connect and disconnect supply power and/or toggle an enable input of the components) of the receive chains $404_1$-$404_4$ to manage power consumption of the receiver 400.

The high-speed data interface 110 may comprise circuitry for receiving data from the DSP 428 and processing the data for communication over a data bus. The high-speed data interface 110 may support various protocols such as one or more of PCMCIA, Ethernet, MoCA, USB, IEEE 1394, and/or any other suitable protocol.

In operation, the entire cable band 102 may be amplified by the variable gain amplifier 402 and the output of the variable gain amplifier 402 may be conveyed to each of the amplifiers $410_1$-$410_B$. Each amplifier $410_b$ may then amplify the sub-band $302_b$. Each mixer may then down-convert the output of the amplifier $410_b$ to an intermediate frequency or to baseband by mixing the output of amplifier $410_b$ with signal $LO_b$. The down-converted signal may be processed via filter $414_b$, and the downconverted and filtered signal may be digitized by the ADC $416_b$. The DSP 428 may then process the signals from each of the ADCs $416_1$-$416_B$ to recover information carried in one or more of the cable television channels 106. The recovered information may then be conveyed to the high-speed interface 100 which may convey the recovered information to, for example another circuit in the same device (e.g., where the receiver 400 resides in a set-top box or gateway) and/or to another device (e.g., to a client device such as a computer or a television).

The processing of the signals output by the DSP 428 may comprise detecting signals present in each of the sub-bands $302_1$-$302_B$, calculating harmonics and/or aliases of the detected signals and/or LO signals $LO_1$-$LO_4$ that fall within one or more of the sub-bands $302_1$-$302_B$, and cancelling those harmonics and/or aliases. This calculation may be performed utilizing knowledge of the frequencies of the signals $LO_1$-$LO_4$, knowledge of the frequency response of the filters $414_1$-$414_B$, and knowledge of sampling frequencies of the ADCs $416_1$-$416_{13}$. Exemplary processing of signals by the DSP 428, via an embodiment of the receiver 400 in which B=4, is described with respect to FIGS. 5A-5G.

Figure 5A:
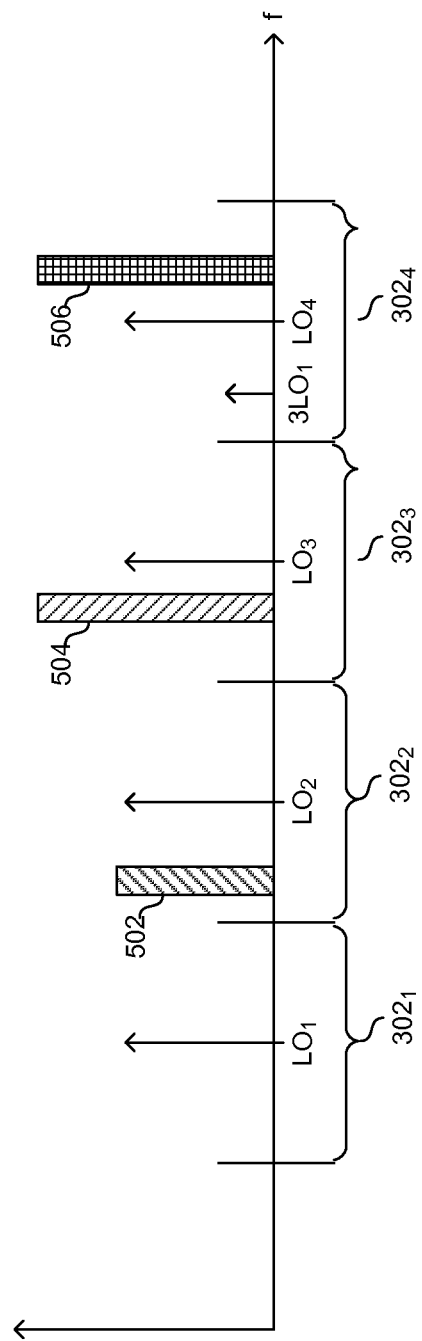

Referring to FIG. 5A, an exemplary spectrum of signals received by the receiver 400 is shown. The spectrum comprises signal 502 located in sub-band $302_2$, signal 504 located in sub-band $302_3$, and signal 506 located in sub-band $302_4$. Each of the signals 502, 504, and 506 may be, for example, a television channel. Also shown are the local oscillator signals $LO_1$-$LO_4$ and the third harmonic of $LO_1$, which falls in sub-band $302_4$. For purposes of illustration, the signal 502 is the signal desired to be output by the receiver 400.

FIG. 5B shows the output of Mixer $412_2$ when the signal of FIG. 5A is input to it. That is, FIG. 5B shows the downconverted version of the spectrum in FIG. 5A (assuming that there is insignificant leakage of signals $LO_2$-$LO_4$ into the receive chain $404_2$). In the exemplary embodiment shown in FIG. 5B, the receiver 400 is a zero-IF receiver and thus the spectrum shown in FIG. 5B is centered around DC (0 Hz).

FIG. 5C shows the filtering of the output of the mixer $412_2$ by the filter $414_2$. The dashed line 520 represents the frequency response of the filter $414_2$. Compared to the frequency response of the filter 124 in FIG. 2, the filter $414_2$ may have a slower roll-off that can be achieved via smaller and/or less-expensive circuitry. The slow roll-off of filter $414_2$, however, results in the out-of-sub-band signal 504 still having significant power at the output of the filter $414_2$. Consequently, when the output of the filter $414_2$ is digitized utilizing sampling frequency fs, as shown in FIG. 5D, the signal 504 may alias to a frequency very near the desired signal 502. Accordingly, the signal 504' may make it difficult to recover the desired signal 502.

As shown in FIGS. 5E and 5F, however, the signal 504 falls within the sub-band operated on by the receive chain $404_3$. Accordingly, the DSP 428 may detect the signal 504 in the output of the ADC $416_3$, calculate the frequency of alias 504' based on its knowledge of the sampling frequency fs, and then cancel out the alias 504'. A similar approach may be taken to cancel out the aliases 506' and 502' shown in FIG. 5G utilizing the signals received from receive chains $404_4$ and $404_2$, respectively, and knowledge of the sampling frequency fs. Moreover, this cancellation approach may be applied to aliases and harmonics appearing in each of the receive chains $404_1$-$404_4$. That is the DSP 428 may utilize the signal received from each one of the receive chains $404_1$-$404_4$, to cancel out undesired signals occurring in the signals received from other ones of the receive chains $404_1$-$404_4$.

Figure 6B:
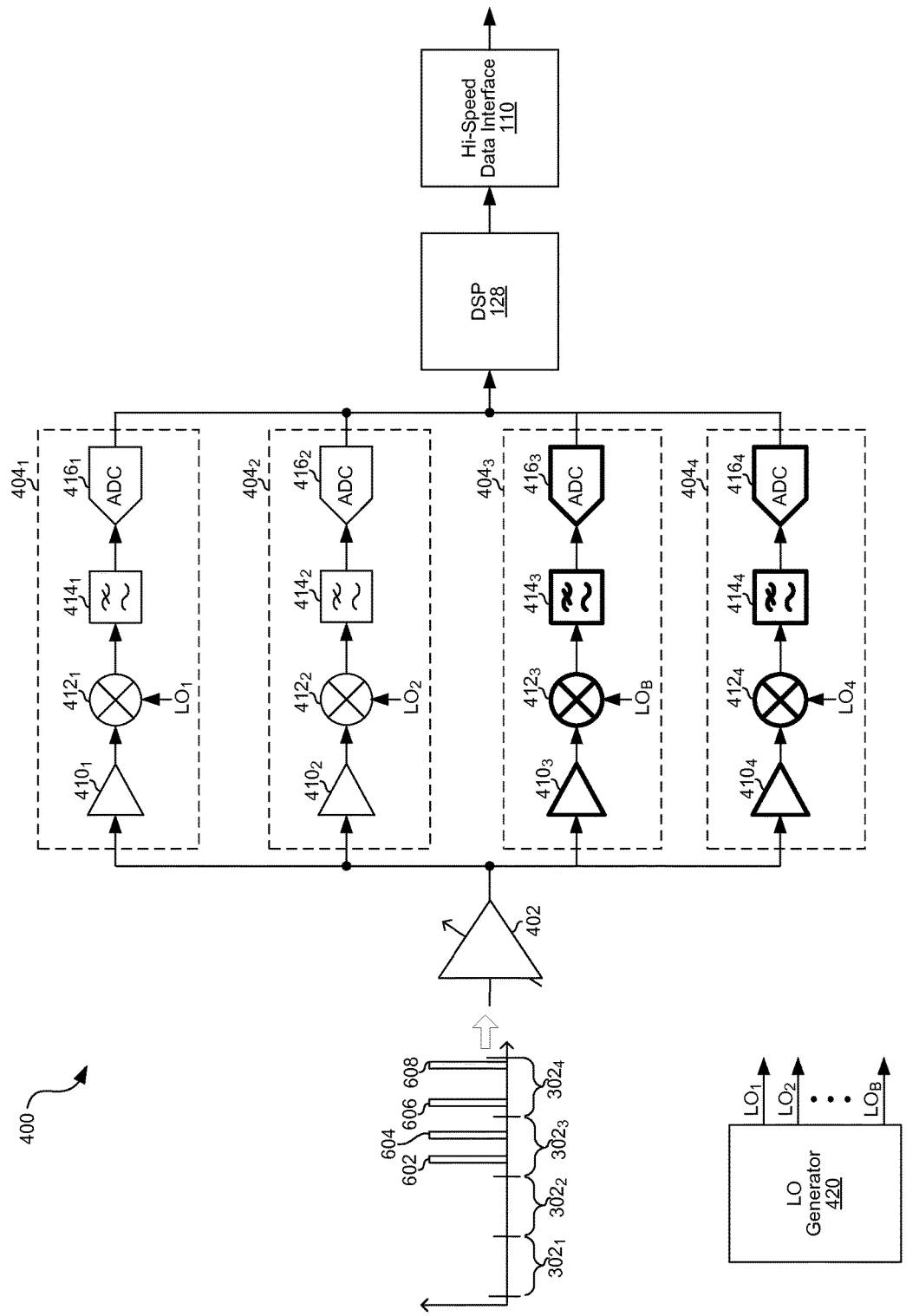

FIG. 6A-6B depict power management in a receiver comprising a plurality of sub-band receive chains. Shown in FIG. 6A, the receiver 400 may receive a signal in which there is a desired channel in each of sub-bands $302_1$-$302_4$. Each of the desired channels 602, 604, 606, and 608 may, for example, be a television channel selected for consumption by a downstream device (e.g., a television or digital video recorder which receives content from the receiver 400). Accordingly, to enable reception of each of the desired channels 602, 604, 606, and 608, the DSP 428 may configure the receiver 400 such that each of the receive chains $404_1$-$404_4$ is powered up (as indicated by the components being bolded). In FIG. 6B, on the other hand, the desired channels 602, 604, 606, and 608 reside in sub-bands $302_3$ and $302_4$. Accordingly, receive chains $404_3$ and $404_4$ are powered up to process bands $302_3$ and $302_4$ whereas receive chains $404_1$ and $404_2$ are powered down to reduce power consumption.

In an exemplary embodiment, a receiver (e.g., receiver 400) may receive a signal (e.g., a cable television signal), and process each of a plurality of sub-bands of the received signal (e.g., each sub-band $302_b$) via a respective one of a plurality of first-type receive chains of the receiver (e.g., receive chain $404_b$ configured to process sub-band $302_b$). The receiver may utilize a signal output by a first one of the plurality of first-type receive chains (e.g., signal output by receive chain $404_2$) to remove undesired signals from a signal output by a second one of the plurality of first-type receive chains (e.g., signal output by receive chain $404_3$). The undesired signals may comprise aliases and/or harmonics of one or more signals that fall within a sub-band of the first one of the plurality of first-type receive chains.

The receiver may downconvert, filter, and digitize each of the plurality of sub-bands (e.g., bands $302_1$-$302_4$) via a corresponding one of the plurality of receive chains (e.g., receive chains $404_1$-$404_4$). Each of the plurality of first-type of receive chains may downconvert a respective one of the plurality of sub-bands utilizing a respective one of a plurality of fixed-frequency local oscillator signals (e.g., signals $LO_1$-$LO_4$). A frequency of each of the plurality of fixed-frequency local oscillator signals may be different than a frequency of each other one of the plurality of fixed-frequency local oscillator signals. The receiver may control whether one or more of the plurality of first-type receive chains is enabled or disabled based on whether a channel to be output by the receiver (e.g., one of the channels 602-608) is located in a sub-band of the received signal that is processed by the one or more of the first-type receive chains.

The received signal may encompass the cable television band, and each of the plurality of sub-bands may comprise a plurality of cable television channels. The receiver may concurrently process all sub-bands of the received signal via at least one second-type receive chain of the receiver (e.g., a receive chain $404_b$ configured to process entire cable band). Each one of the plurality of sub-bands may be substantially non-overlapping with each other one of the plurality of sub-bands.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for Method and apparatus for broadband data conversion.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
   one or more circuits of a receiver, said one or more circuits comprising a plurality of first-type receive chains, each of said plurality of first-type receive chains being operable to process a respective one of a plurality of sub-bands of a received signal; and
   a digital signal processing module operable to utilize a signal output by a first one of said plurality of first-type receive chains to remove undesired signals from a signal output by a second one of said plurality of first-type receive chains.

2. The system of claim 1, wherein said undesired signals comprise aliases of one or more signals within one of said plurality of sub-bands processed by said first one of said plurality of first-type receive chains.

3. The system of claim 1, wherein said undesired signals comprise harmonics of one or more signals within one of said plurality of sub-bands processed by said first one of said plurality of first-type receive chains.

4. The system of claim 1, wherein each of said plurality of first-type receive chains is operable to downconvert, filter, and digitize said respective one of said plurality of sub-bands of said received signal.

5. The system of claim 1, wherein each of said plurality of first-type receive chains downconverts said respective one of said plurality of sub-bands of said received signal utilizing a respective one of a plurality of fixed-frequency local oscillator signals.

6. The system of claim 5, wherein a frequency of each one of said plurality of fixed-frequency local oscillator signals is different than a frequency of each other one of said plurality of fixed-frequency local oscillator signals.

7. The system of claim 1, wherein said one or more circuits are operable to enable and disable one or more of said plurality of first-type receive chains based on whether a channel to be output by said receiver is located in one of said plurality of sub-bands of said received signal that is processed by said one or more of said plurality of first-type receive chains.

8. The system of claim 1, wherein:
   said received signal encompasses a cable television band; and
   each of said plurality of sub-bands of said received signal comprises a plurality of cable television channels.

9. The system of claim 1, wherein said one or more circuits comprise at least one second-type receive chain that is operable to concurrently process all of said plurality of sub-bands of said received signal.

10. The system of claim 1, wherein each one of said plurality of sub-bands of said received signal is substantially non-overlapping with each other one of said plurality of sub-bands of said received signal.

11. A method comprising:
    receiving a first signal;
    processing each of a plurality of sub-bands of said received first signal via a respective one of a plurality of first-type receive chains of a receiver;
    utilizing a signal output by a first one of said plurality of first-type receive chains to remove undesired signals from a signal output by a second one of said plurality of first-type receive chains.

12. The method of claim 11, wherein said undesired signals comprise aliases of one or more signals within one of said plurality of sub-bands processed by said first one of said plurality of first-type receive chains.

13. The method of claim 11, wherein said undesired signals comprise harmonics of one or more signals within one of said plurality of sub-bands processed by said first one of said plurality of first-type receive chains.

14. The method of claim 11, comprising downconverting, filtering, and digitizing each of said plurality of sub-bands of said received first signal via a corresponding one of said plurality of first type receive chains.

15. The method of claim 11, wherein each of said plurality of first-type receive chains downconverts a respective one of said plurality of sub-bands of said received first signal utilizing a respective one of a plurality of fixed-frequency local oscillator signals.

16. The method of claim 15, wherein a frequency of each one of said plurality of fixed-frequency local oscillator signals is different than a frequency of each other one of said plurality of fixed-frequency local oscillator signals.

17. The method of claim 11, comprising controlling whether one or more of said plurality of first-type receive chains is enabled or disabled based on whether a channel to be output by said receiver is located in a sub-band of said received first signal that is processed by said one or more of said plurality of first-type receive chains.

18. The method of claim 11, wherein:
    said received first signal encompasses a cable television band; and
    each of said plurality of sub-bands of said received signal comprises a plurality of cable television channels.

19. The method of claim 11, comprising concurrently processing all of said plurality of sub-bands of said received first signal via at least one second-type receive chain of said receiver.

20. The method of claim 11, wherein each one of said plurality of sub-bands of said received first signal is substantially non-overlapping with each other one of said plurality of sub-bands of said received first signal.

* * * * *

UNITED STATES PATENT AND TRADEMARK OFFICE
CERTIFICATE OF CORRECTION

| | |
|---|---|
| PATENT NO. | : 9,991,847 B2 |
| APPLICATION NO. | : 13/336451 |
| DATED | : June 5, 2018 |
| INVENTOR(S) | : Madhukar Reddy et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1441 days.

Signed and Sealed this
Seventh Day of February, 2023

Katherine Kelly Vidal
*Director of the United States Patent and Trademark Office*